United States Patent [19]

Schwabe

[11] 4,175,983

[45] Nov. 27, 1979

[54] PROCESS FOR THE PRODUCTION OF A HIGH FREQUENCY TRANSISTOR

[75] Inventor: Ulrich Schwabe, Munich, Fed. Rep. of Germany

[73] Assignee: Siemens Aktiengesellschaft, Berlin & Munich, Fed. Rep. of Germany

[21] Appl. No.: 915,368

[22] Filed: Jun. 14, 1978

[30] Foreign Application Priority Data

Jun. 27, 1977 [DE] Fed. Rep. of Germany ....... 2728845

[51] Int. Cl.$^2$ ............... H01L 21/22; H01L 21/26; H01L 29/72
[52] U.S. Cl. ............................. 148/1.5; 148/187; 357/34; 357/91
[58] Field of Search ............... 148/1.5, 187; 357/34, 357/91

[56] References Cited

U.S. PATENT DOCUMENTS

| | | | |
|---|---|---|---|
| 3,904,450 | 9/1975 | Evans et al. | 148/175 |
| 3,933,540 | 1/1976 | Kondo et al. | 148/187 |
| 3,996,077 | 12/1976 | Corneus et al. | 148/187 |
| 4,008,107 | 2/1977 | Hayasaka et al. | 148/175 |
| 4,066,473 | 1/1976 | O'Brien | 148/1.5 |

OTHER PUBLICATIONS

Evans et al., ". . . Ion Implanted Bipolar Transistors . . .", 1973 IEEE Int. Solid State Circuits, Conf., Phila., Pa. 174.
Graul et al., "Bipolar . . . Double Implanted Transistors", IEEE J. Solid St. Circuits, SC-10, 1975, 201.
Hung et al., "Double Ion–Implanted Bipolar . . ." IBM-TDB, 17 (1974), 1536.
Payne et al., ". . . Ion Implanted Bipolar . . .", IEEE, vol. ED-21, 1974, 272.

*Primary Examiner*—L. Dewayne Rutledge
*Assistant Examiner*—Upendra Roy
*Attorney, Agent, or Firm*—Hill, Van Santen, Steadman, Chiara & Simpson

[57] ABSTRACT

A process is disclosed for producing a high frequency transistor having a small emitter width. The high frequency transistor has a base zone consisting of an inactive region and of an active region. The lateral extension of the active region is determined by a "beak-shaped" portion of the insulation oxide. In order to permit the least possible number of process steps, the ion implanted base zone is not produced until the emitter window is opened. The invention is particularly suited for the production of integrated circuits.

6 Claims, 7 Drawing Figures

PROCESS FOR THE PRODUCTION OF A HIGH FREQUENCY TRANSISTOR

BACKGROUND OF THE INVENTION

The invention relates to a process for the production of a high frequency transistor, particularly in an integrated circuit. The transistor is in a semiconductor body and is electrically insulated from adjacent semiconductor components by insulating layers. The base zone consists of two differently doped zones of which one determines the effective emitter width and is produced by ion implantation in accordance with U.S. Patent Application Ser. No. 749,609, now U.S. Pat. No. 4,110,779 incorporated herein by reference.

In order to achieve as high as possible a degree of integration in integrated circuits, frequently high frequency transistors having a small emitter width and a small base bulk resistance are required. Usually, the minimum emitter width is determined by the lower limit values which can be attained with the photo-lacquer and etching technique. Furthermore, the base bulk resistance can be reduced by implanting a stepped profile (IEEE Transactions on Electron Devices, Vo. ED 21, No. 4, April 1974, Pages 273-278.

As is known, the oxide insulation technique has the advantage that no insulating trough with lateral insulation diffusions are required in order to electrically isolate a component from an adjacent component. Thus a higher degree of integration can be achieved with the oxide insulation technique.

In order to provide a high frequency transistor which has the least possible emitter width and a small base bulk resistance, and which exploits the advantages of the oxide insulation technique and the photolacquer and etching technique, it has already been suggested (See Ser. No. 749,609) that the base zone consists of two differently doped zones, of which the one zone establishes the effective emitter width. The zone which establishes the effective emitter width can consist of a region between an oxide layer and the other zone of the base zone.

Thus the base zone comprises a preferably p doped, active base zone and a preferably p+ highly doped, inactive base zone. The inactive base zone is bounded by the "beak-shaped" region which is formed during the oxidation of the insulating oxide layers. It is in fact in this region that the zone which is doped oppositely to the base zone runs obliquely upwards to the surface of the semiconductor body. Thus between the inactive, highly-doped base zone and the oxide layer there exists an oppositely doped region whose width represents the effective emitter width. In this way, emitter widths of 0.1 to 0.5 μm can be produced independently of phototechnical processes. Furthermore, the inactive base zone reduces the base bulk resistance.

Previously, following the diffusion of the inactive base zone, the emitter window is opened and the active base zone is produced by ion implantation. This active base zone is bounded on the one side by the oxide layer and on the other side by the inactive base zone whereby a self-adjustment is provided.

SUMMARY OF THE INVENTION

It is an object of the invention to improve this conventional process, so that it involves fewer process steps and in this way is more suitable for mass production.

This object is realized in accordance with the invention in that the other zone of the base zone is produced together with the one zone by ion implantation.

Preferably, a masking layer is provided above the other zone during the ion implantation.

In another further development of the invention, the one and the other zone of the base zone are implanted in two steps, the masking layer being applied prior to the ion implantation of the second step.

It is advantageous that a $Si_3N_4$ layer is used as masking layer.

Finally, it is also advantageous that the base zone is only implanted after the emitter window has been opened.

DESCRIPTION OF THE PREFERRED EMBODIMENTS

Figure 1:
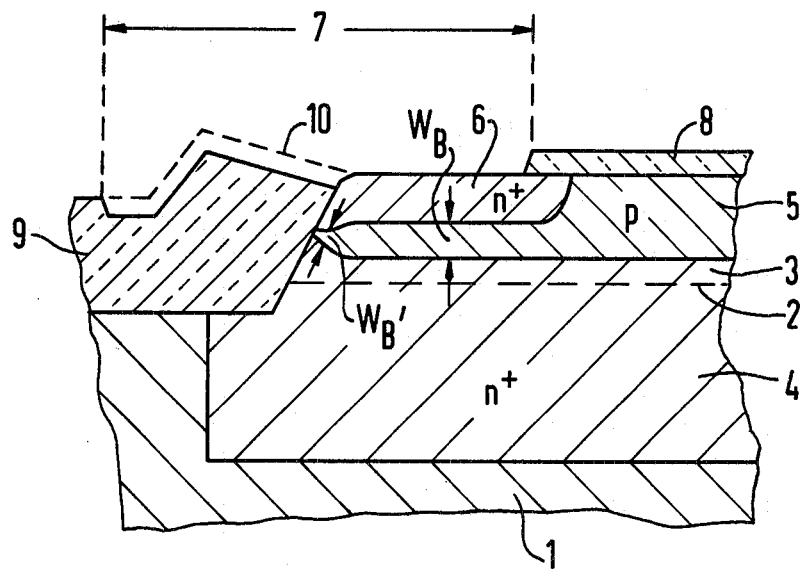
FIG. 1 is a section through a transistor produced following the etching of the emitter window and the diffusion of the emitter zone in accordance with previous processes.

In FIG. 1 a n+-conductive, epitaxial layer 3 is arranged on a p-conductive semiconductor substrate 1 with a n+-conductive collector zone 4 produced by diffusion, the boundary between the semiconductor substrate 1 and the epitaxial layer 3 being indicated by a dash-line 2. In the epitaxial layer 3, a p-conductive base zone 5 produced by ion implantation or diffusion, which itself contains a n+-conductive emitter zone 6 which is produced by diffusion through an emitter window 7. The emitter window 7 is on one side bounded by a silicon dioxide layer 8 and on the other side extends over a thick silicon dioxide layer 9 which serves for the isolation of adjacent components. The left boundary of the emitter window 7 in FIG. 1 is not critical, so that during the etching of the emitter window 7 into the silicon dioxide layer 8 no exact dimensions need be adhered to here, which is indicated by the broken line 10. That is to say, the emitter window 7 could also extend less or more to the left in FIG. 1 if an adjacent component is not contacted and the surface of the zone 6 is exposed.

The etching of the emitter window 7 results in the base width being reduced on the edge of the silicon dioxide layer 9 because of the co-etching of this layer, so that instead of the actual base width $W_B$ a reduced base width $W_B'$ which can cause collector-emitter short circuits occurs here.

In FIGS. 2 to 7 parts which correspond to one another are provided with the same reference symbols as in FIG. 1.

It is a significant feature of the invention that the base zone 5 is only implanted after the emitter window 7 has been opened. The implantation is selected in such manner that the doping maximum of the base zone 5 lies under a masking layer. Since no etching step takes place between the base implantation and the emitter diffusion, a constant base width is also achieved along the silicon dioxide layer 9. This process sequence is applicable for both a one-step base and also a two-step base.

Figure 2:
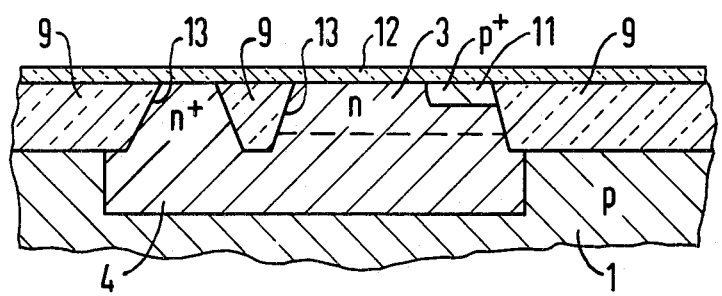
FIGS. 2-4 are cross-sectional views showing a first exemplary embodiment of the process in accordance with the invention.

FIG. 2 shows a cross-sectional view following the diffusion of the collector zone 4 and a p+-conductive base contact terminal region 11. Furthermore, a silicon nitride layer 12 is provided on the surface of the epitaxial layer 3. The p-conductive semiconductor substrate 1, for example, has a specific resistance of 0.5 Ohm-cm and a (100) orientation. The collector zone 4 (buried layer) has a layer resistance of 30 Ohm/□. The epitaxial layer 3, for example, has a specific resistance of 0.8 Ohm-cm and a thickness of 2.0 μm. The pits 13 which are filled up by the silicon dioxide layer 9 are first introduced into the epitaxial layer 3 at a depth of 1.5 μm. As a result of the subsequent oxidation of these pits 13, the 2.0 μm thick silicon dioxide layer 9 is produced. The silicon nitride layer 12 is applied with a thickness of 1600 Å following the diffusion of the collector zone 4 and the base contact terminal region 11.

Figure 3:
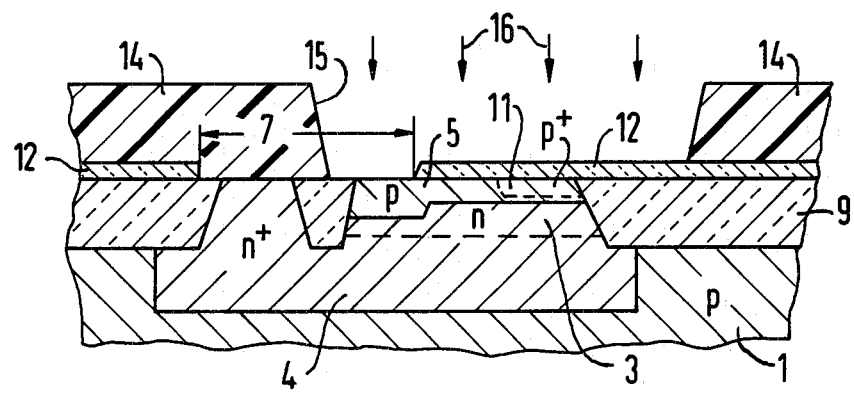

Following the etching of the emitter window 7 into the silicon nitride layer 12 and the application of a photo-lacquer layer 14 having a window 15, the base zone 5 is implanted into the epitaxial layer 3 which is indicated by arrows 16 (FIG. 3). The energy of implantation is selected in such manner that the doping maximum of the base zone 5 lies under the silicon nitride layer 12 in order to establish a connection between the base contact terminal region 11 and the region of the subsequent emitter diffusion. The photo-lacquer layer 14 serves as a masking layer for the ion implantation.

Figure 4:
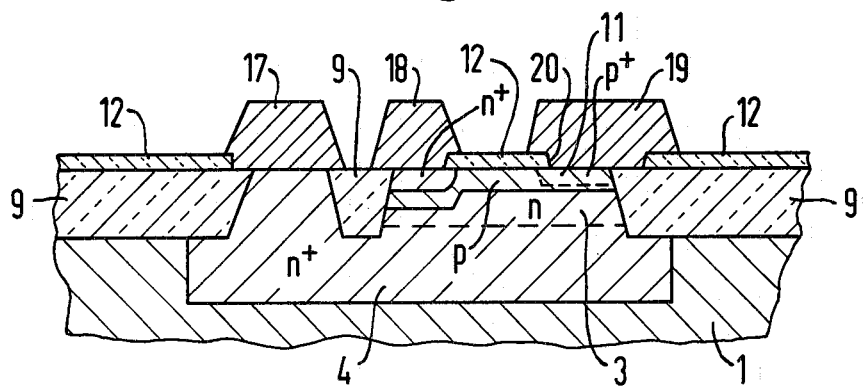

FIG. 4 shows the completed transistor comprising a collector contact 17, an emitter contact 18 and a base contact 19, all of which consist of metal. Beforehand, a window 10 to the base contact terminal 11 was introduced in the silicon nitride layer 12.

The energy of implantation preferably amounts to 150 keV whereas $8.5 \times 10^{13}$ is preferred for the implantation dosage.

Figure 5:
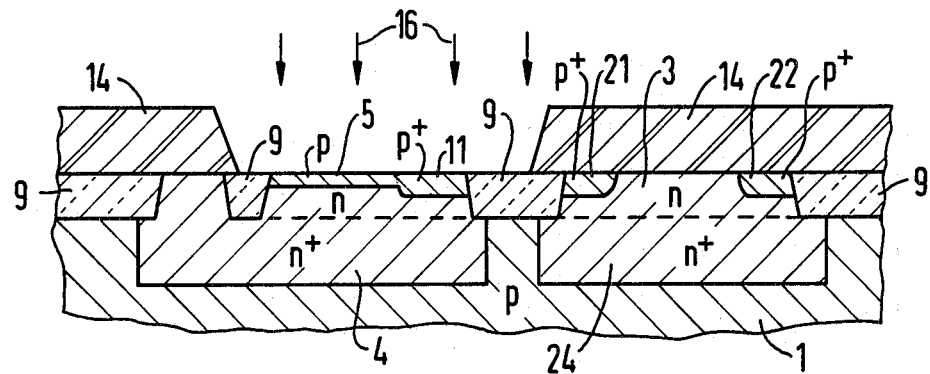
FIGS. 5-7 are cross-sectional views showing a second exemplary embodiment of the process in accordance with the invention.
Figure 6:
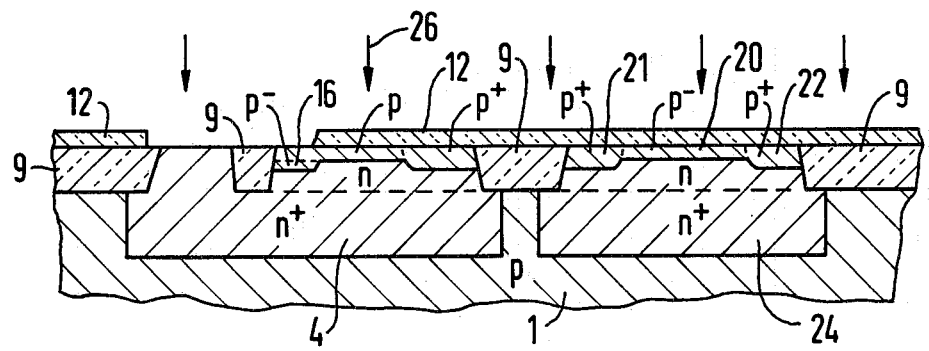
Figure 7:
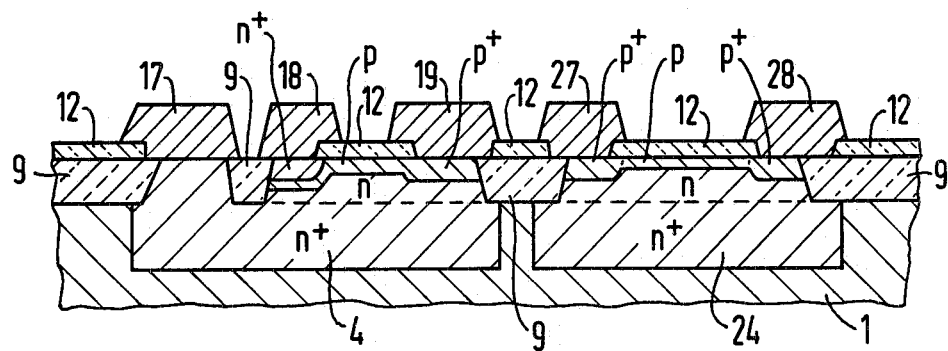

In a further development of the invention, the base bulk resistance can be reduced by implanting a stepped profile. A relevant exemplary embodiment of the invention is illustrated in FIGS. 5 to 7. These figures illustrate the production of a transistor together with a high-resistance resistance member 20. In FIG. 5 the transistor is shown prior to the coating with the silicon nitride layer 12 (in this exemplary embodiment the photo-lacquer layer 14 is applied prior to the silicon nitride layer 12).

In FIG. 5, to the right of the above described transistor there is provided a further n+-doped zone 24 which together with a n+-conductive collector zone 4 is produced by diffusion. Together with the base contact terminal region 11, P+-conductive resistance terminal contact regions 21 and 22 are introduced in the epitaxial layer 3 by diffusion prior to the application of the photo-lacquer layer 14.

Following the implantation of the base zone 5 (see arrows 16 in FIG. 5) the silicon nitride layer 12 is applied (FIG. 6) and subsequently a new ion implantation is executed which is indicated by arrows 26. In this way the doping concentration of the base zone 5 is increased on the surface and the high-resistance resistance 20 is produced simultaneously. Finally, in addition to the contacts 17, 18 and 19, contacts 27 and 28 are produced for the high-resistance resistance member 20.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A method for the production of a high frequency transistor formed in insulated fashion within a semiconductor body of an integrated circuit, comprising the steps of:
    (a) providing a semiconductor substrate of first conductivity type;
    (b) diffusing a collector region of second conductivity type in the substrate and exposed at a surface of the substrate;
    (c) providing an insulating region in the collector region;
    (d) diffusing a base contact zone of first conductivity type in the collector region;
    (e) providing an insulating layer over the exposed surface of the collector region;
    (f) opening an emitter window in the insulating layer over a portion of the exposed surface of the collector region between the insulating region and base contact zone;
    (g) ion implanting an active base zone through the window and simultaneously through the insulating layer to create a connecting zone between the active base zone and the base contact zone; and
    (h) diffusing an emitter zone of second conductivity type in the active base zone.

2. The method of claim 1 wherein an energy for the ion implanting is sufficient to form a maximum of connecting zone conductivity below the insulating layer in the substrate.

3. A method for the production of a thin base transistor in a semiconductor body, comprising the steps of: providing a collector zone in the semiconductor body; providing an insulation zone and a base contact zone in the collector zone; ion implanting a base zone adjacent the insulation zone and simultaneously a base connecting zone between the base zone and the base contact zone; applying an insulating layer over the base contact zone, connecting zone, and base zone; creating an emitter zone window in the insulating layer above the base zone; further ion implanting through the window and through the insulating zone to further dope the base connecting zone, base contact zone, and at the region of the base zone; and providing an emitter zone in the base zone adjacent the insulation zone.

4. The method of claim 3 wherein the base zone is implanted deeper during the further ion implanting.

5. A method for the production of a thin base transistor in a semiconductor body, comprising the steps of: providing a collector zone in the semiconductor body; providing an insulation zone and a base contact zone in the collector zone; applying an insulating layer over the collector zone; creating an emitter zone window in the masking layer between the insulation zone and the base contact zone; simultaneously ion implanting through the emitter window and through the insulating layer so as to create an active base zone below the emitter window and a base connecting zone between the active base zone and the base contact zone; and diffusing the emitter zone through the emitter zone window in the active base zone but to a depth less than the active base zone so as to provide a thin active base.

6. A method as claimed in claim 5 including the step of providing the insulating layer as a $Si_3\text{-}N_4$ layer.

* * * * *